United States Patent
Hong et al.

(10) Patent No.: US 10,784,342 B1
(45) Date of Patent: Sep. 22, 2020

(54) SINGLE DIFFUSION BREAKS FORMED WITH LINER PROTECTION FOR SOURCE AND DRAIN REGIONS

(71) Applicant: GLOBALFOUNDRIES Inc., Grand Cayman (KY)

(72) Inventors: Wei Hong, Clifton Park, NY (US); Hong Yu, Clifton Park, NY (US); Jianwei Peng, Clifton Park, NY (US); Hui Zhan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/385,197

(22) Filed: Apr. 16, 2019

(51) Int. Cl.
| | |
|---|---|
| *H01L 29/06* | (2006.01) |
| *H01L 29/78* | (2006.01) |
| *H01L 27/088* | (2006.01) |
| *H01L 21/8234* | (2006.01) |
| *H01L 21/762* | (2006.01) |
| *H01L 29/66* | (2006.01) |

(52) U.S. Cl.
CPC .... *H01L 29/0653* (2013.01); *H01L 21/76224* (2013.01); *H01L 21/823431* (2013.01); *H01L 21/823481* (2013.01); *H01L 27/0886* (2013.01); *H01L 29/66795* (2013.01); *H01L 29/7851* (2013.01)

(58) Field of Classification Search
CPC ....... H01L 21/76224; H01L 21/823431; H01L 21/823481; H01L 27/0886; H01L 29/66795

See application file for complete search history.

(56) References Cited

U.S. PATENT DOCUMENTS

| | | | |
|---|---|---|---|
| 8,846,491 B1 | 9/2014 | Pham et al. | |
| 8,916,460 B1 | 12/2014 | Kwon et al. | |
| 9,406,676 B2* | 8/2016 | Yu | H01L 21/823481 |
| 9,412,616 B1 | 8/2016 | Xie et al. | |
| 9,935,104 B1* | 4/2018 | Wang | H01L 21/02164 |
| 2014/0117454 A1 | 5/2014 | Liu et al. | |
| 2016/0336234 A1* | 11/2016 | Kim | H01L 21/823431 |
| 2019/0165137 A1* | 5/2019 | Chen | H01L 27/0924 |
| 2019/0172753 A1* | 6/2019 | Lin | H01L 29/66545 |
| 2019/0326407 A1* | 10/2019 | Yoon | H01L 27/0886 |

OTHER PUBLICATIONS

Hui Zang et al., "Single Diffusion Cut for Gate Structures" filed Mar. 28, 2019 as U.S. Appl. No. 16/367,733.

* cited by examiner

*Primary Examiner* — Hsien Ming Lee
(74) *Attorney, Agent, or Firm* — Thompson Hine LLP; Francois Pagette

(57) ABSTRACT

Structures that include a single diffusion break and methods of forming a single diffusion break. A source/drain region is arranged inside a first cavity in a semiconductor fin, and a dielectric layer is arranged inside a second cavity in the semiconductor fin. A liner, which is composed of a dielectric material, includes a section that is arranged inside the second cavity laterally between the dielectric layer and the source/drain region.

17 Claims, 11 Drawing Sheets

US 10,784,342 B1

SINGLE DIFFUSION BREAKS FORMED WITH LINER PROTECTION FOR SOURCE AND DRAIN REGIONS

BACKGROUND

The present invention relates to semiconductor device fabrication and integrated circuits and, more specifically, to structures that include a single diffusion break and methods of forming a single diffusion break.

Complementary-metal-oxide-semiconductor (CMOS) processes may be used to build a combination of p-type and n-type field-effect transistors that are used to construct, for example, logic cells. Field-effect transistors generally include a body supplying a channel region in a substrate, a source, a drain, and a gate electrode over the body. When a control voltage exceeding a characteristic threshold voltage is applied to the gate electrode, carrier flow occurs in the channel region between the source and drain to produce a device output current.

A fin-type field-effect transistor (FinFET) is a non-planar device structure that may be more densely packed in an integrated circuit than planar field-effect transistors. A fin-type field-effect transistor may include a fin consisting of a body of semiconductor material, a gate structure that wraps about the fin, and heavily-doped source/drain regions spaced along the fin and arranged on opposite sides of the gate structure. The gate structures may extend longitudinally across the fins of fin-type field-effect transistors associated with different active device regions. Lower portions of the fins are embedded in shallow trench isolation and upper portions of the fins are overlapped by the gate structures. The source/drain regions may be formed in cavities that are etched in the fins.

Diffusion breaks may be used to isolate different transistors or groups of transistor from each other. Part of the process used to form a diffusion break involves cutting the fins and forming a dielectric layer in the cuts. The fin cut may be performed after the gate structures are formed and after the epitaxial semiconductor material forming the source/drain regions is grown from the fins. However, the isotropic etching process used to perform the portion of the fin cut removing the lower portions of the fins from the shallow trench isolation may also unwantedly etch the epitaxial semiconductor material of the source/drain regions due to a lateral etch component of the isotropic etching process.

Improved structures that include a single diffusion break, as well as methods of forming a single diffusion break, are needed.

SUMMARY

In an embodiment of the invention, a structure for a single diffusion break is provided. The structure includes a semiconductor fin including a first cavity and a second cavity, a source/drain region inside the first cavity in the semiconductor fin, a dielectric layer inside the second cavity in the semiconductor fin, and a liner composed of a dielectric material. The liner includes a section inside the second cavity, and the section of the liner is laterally arranged between the dielectric layer and the source/drain region.

In an embodiment of the invention, a method of forming a single diffusion break is provided. The method includes epitaxially growing a semiconductor material in a first cavity in a semiconductor fin to form a source/drain region, removing a section of a gate structure from a section of the semiconductor fin adjacent to the source/drain region, and removing an upper portion of the section of the semiconductor fin to define a second cavity in the semiconductor fin. The method further includes forming a section of a liner on a first surface of the semiconductor fin bordering the second cavity and, after forming the section of the liner, removing a lower portion of the section of the semiconductor fin to extend a depth of the second cavity. The method further includes forming a dielectric layer inside the second cavity.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
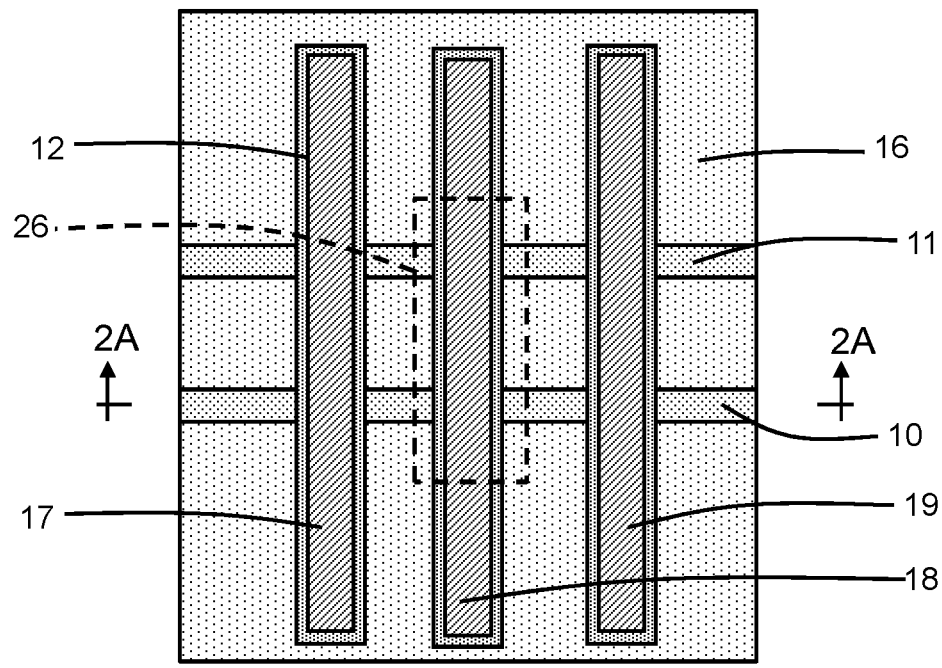
FIG. 1 is a top view of a structure at an initial fabrication stage of a processing method in accordance with embodiments of the invention.
Figure 2:
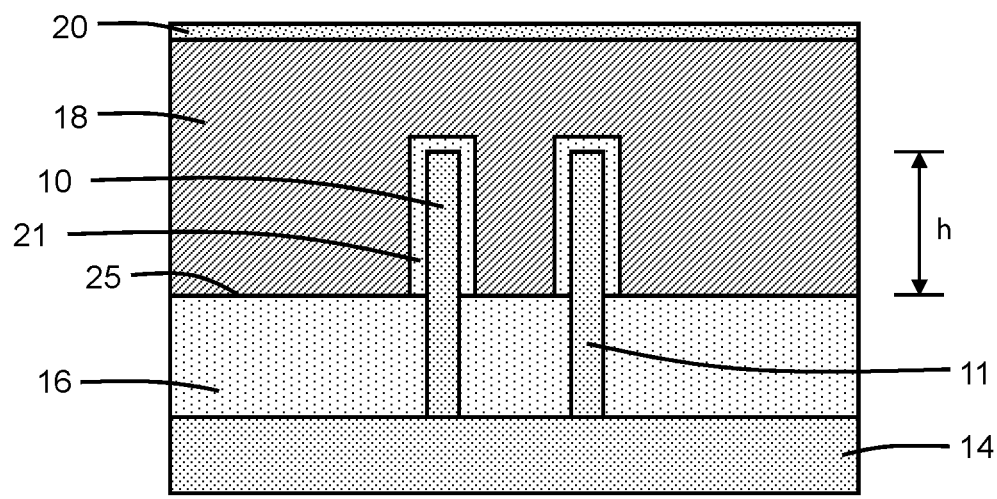
FIG. 2 is a cross-sectional view taken generally along line 2-2 in FIG. 1.
Figure 2A:
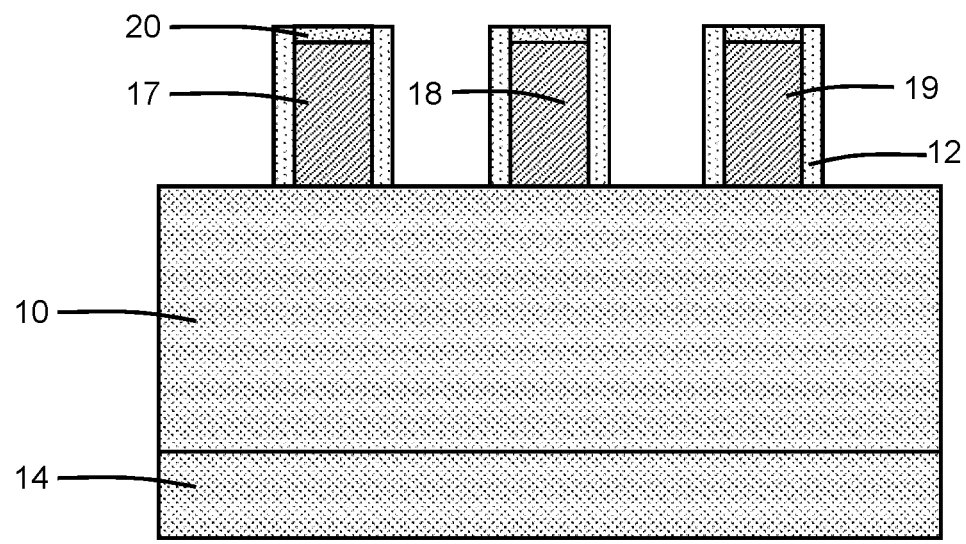
FIG. 2A is a cross-sectional view taken generally along line 2A-2A in FIG. 1.

With reference to FIGS. 1, 2, 2A and in accordance with embodiments of the invention, a structure includes fins 10, 11 that are arranged over, and project upwardly away from, a substrate 14. The fins 10, 11 and the substrate 14 may be composed of a single-crystal semiconductor material, such as single-crystal silicon. The fins 10, 11 may be formed by patterning the substrate 14 with lithography and etching processes or by a self-aligned multi-patterning process, and cutting the patterned fins 10, 11 into given lengths. A shallow trench isolation region 16 is formed that operates to electrically isolate the fins 10, 11 from each other. The shallow trench isolation region 16 may be formed by depositing a layer composed of a dielectric material, such as an oxide of silicon (e.g., silicon dioxide), by chemical vapor deposition, and recessing the deposited layer with an etching process.

An upper portion of the fins 10, 11 is revealed above a top surface 25 of the shallow trench isolation region 16, and a lower portion of the fins 10, 11 is surrounded by the shallow trench isolation region 16 below the top surface 25. The upper portions of the fins 10, 11 project or extend above the top surface 25 of the shallow trench isolation region 16 with a height, h.

Gate structures 17, 18, 19 extend laterally along respective longitudinal axes over and across the fins 10, 11 and shallow trench isolation region 16. Each of the gate structures 17, 18, 19 is arranged transverse to the fins 10, 11 and overlaps with, and wraps about, respective sections (e.g., channel regions) of the fins 10, 11. The gate structures 17, 18, 19 are also arranged in part on the top surface 25 of portions of the shallow trench isolation region 16 between the fins 10, 11 and adjacent to the fins 10, 11.

The gate structures 17, 18, 19 may be dummy gates representing placeholder elements for subsequently-formed gate structures, such as metal gate structures formed by a replacement metal gate process. The gate structures 17, 18, 19 have a spaced-apart arrangement along the respective longitudinal axes of the fins 10, 11. The gate structures 17, 18, 19 may be formed by depositing a layer of a sacrificial material, such as amorphous silicon, and then patterning this deposited layer with lithography and etching processes. A thin dielectric layer 21 composed of, for example, silicon dioxide, may be arranged between the fins 10, 11 and the gate structures 17, 18, 19. A gate cap 20 composed of a dielectric material, such as silicon nitride, is arranged over each gate structure 17, 18, 19.

Sidewall spacers 12 are arranged adjacent to the sidewalls of the gate structures 17, 18, 19. The sidewall spacers 12 may be formed by depositing a conformal layer composed of a dielectric material, such as silicon dioxide, and etching the deposited layer with an anisotropic etching process, such as reactive ion etching.

Figure 3:
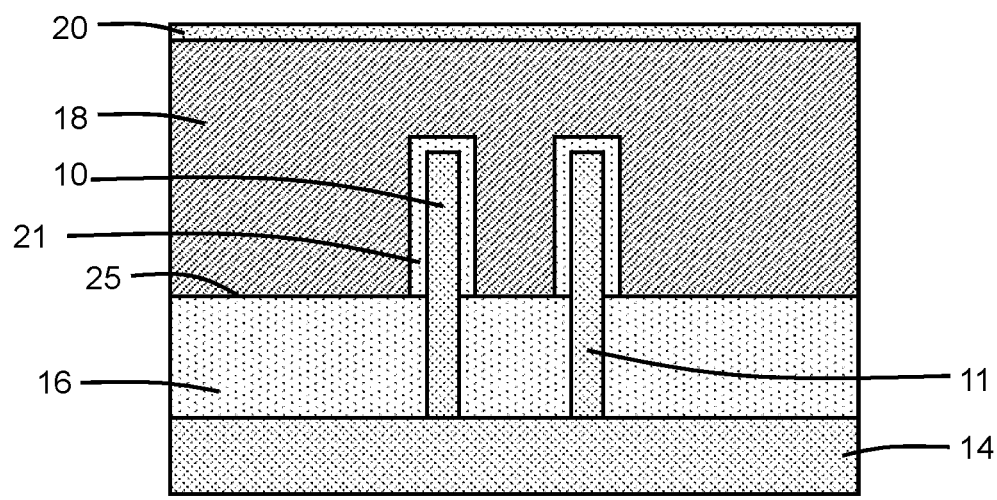
FIGS. 3, 3A are cross-sectional views of the structure at a fabrication stage of the processing method subsequent to FIGS. 2, 2A.
Figure 3A:
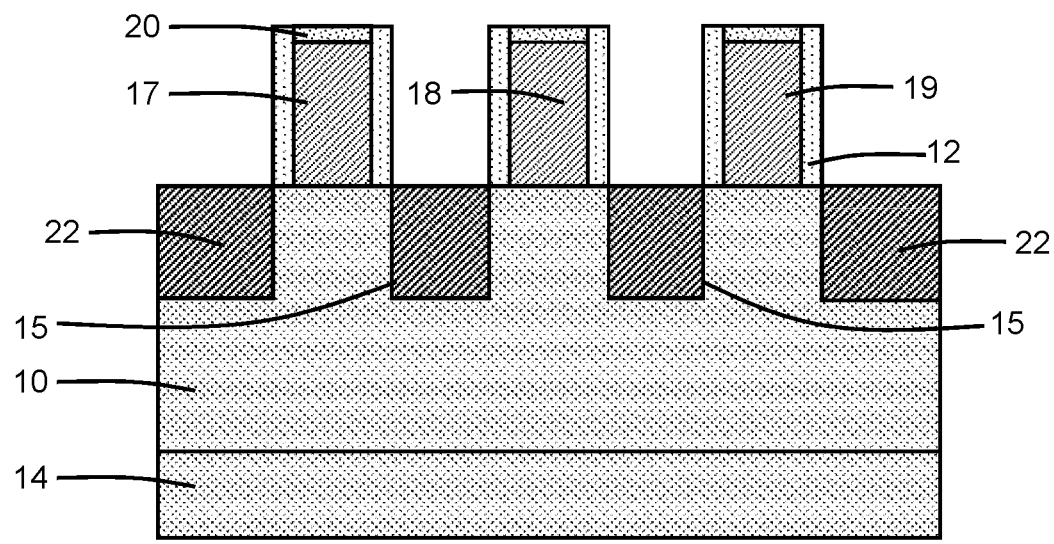

With reference to FIGS. 3, 3A in which like reference numerals refer to like features in FIGS. 2, 2A and at a subsequent fabrication stage of the processing method, source/drain regions 22 are disposed within cavities 15 defined in the fins 10, 11 at locations laterally between the spacer-clad gate structures 17, 18, 19. As used herein, the term "source/drain region" means a doped region of semiconductor material that can function as either a source or a drain of a field-effect transistor. The cavities 15 may be formed and shaped in the fins 10, 11 by one or more etching processes. The source/drain regions 22 may be provided by the epitaxial growth of a semiconductor material from surfaces of the fins 10, 11, and their formation may follow the formation of the gate structures 17, 18, 19. The source/drain regions 22 may contain an n-type dopant (e.g., phosphorus and/or arsenic) that provides n-type conductivity. Alternatively, the source/drain regions 22 may contain a p-type dopant (e.g., boron) that provides p-type conductivity.

Figure 4:
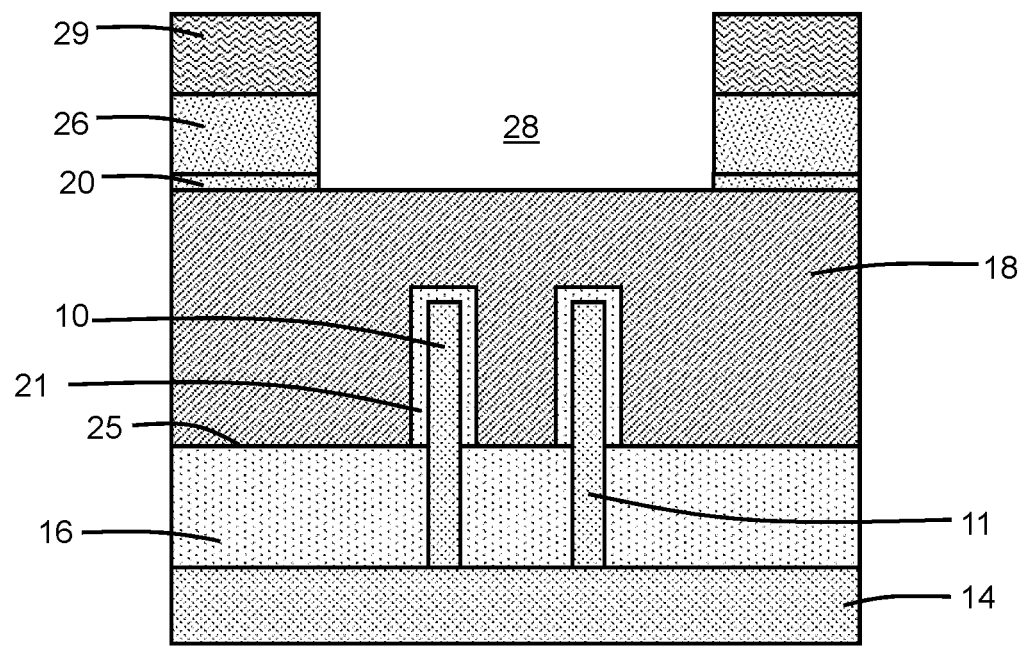
FIGS. 4, 4A are cross-sectional views of the structure at a fabrication stage of the processing method subsequent to FIGS. 3, 3A.
Figure 4A:
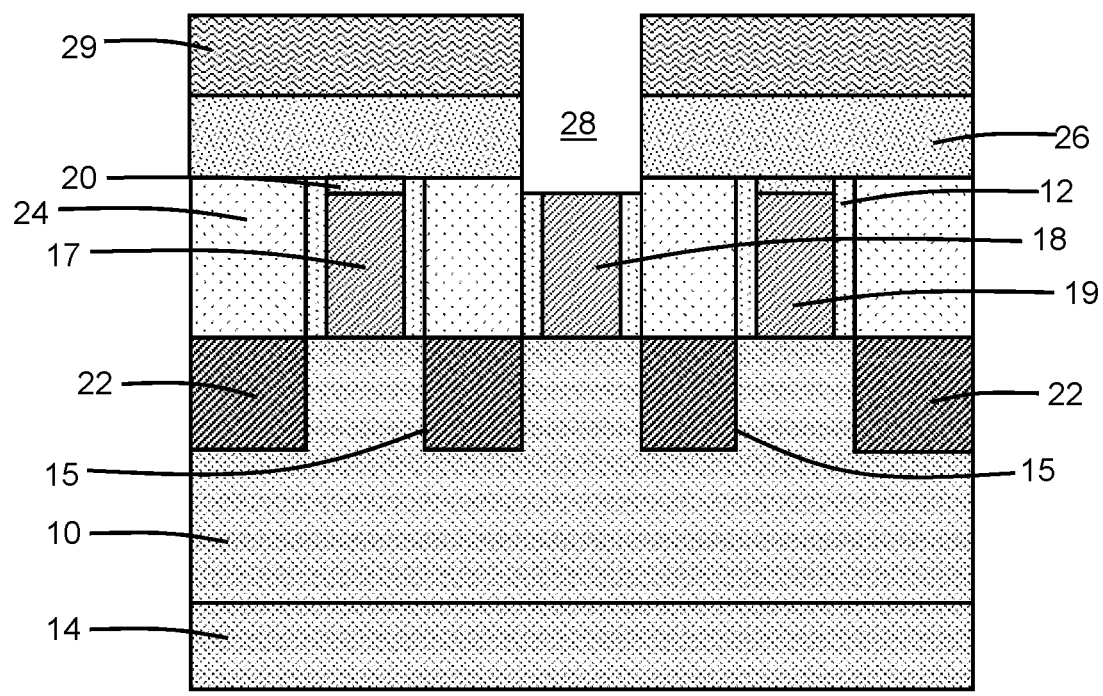

With reference to FIGS. 4, 4A in which like reference numerals refer to like features in FIGS. 3, 3A and at a subsequent fabrication stage of the processing method, an interlayer dielectric layer 24 is formed that includes sections arranged over the source/drain regions 22. The interlayer dielectric layer 24 may be composed of a dielectric material, such as silicon dioxide, that is deposited, for example, by chemical vapor deposition and planarized, for example, by chemical vapor deposition. Prior to forming the interlayer dielectric layer 24, a contact etch-stop layer (not shown) composed of a thin layer of a dielectric material, such as silicon nitride, may be conformally deposited that provides a liner between the sections of the interlayer dielectric layer 24 and the source/drain regions 22.

A hardmask layer 26 is formed over the gate caps 20 and the sections of the interlayer dielectric layer 24. The hardmask layer 26 may be formed by, for example, chemical vapor deposition and may be composed of a dielectric material, such as silicon nitride. The hardmask layer 26 may be patterned by lithography and etching processes to define an opening 28 that penetrates fully through its thickness. To that end, an etch mask 29 may be formed by lithography over the hardmask layer 26. The etch mask 29 may include a layer of, for example, an organic photoresist that is applied by a spin coating process, pre-baked, exposed to light projected through a photomask, baked after exposure, and developed with a chemical developer to define an opening over the intended location of the opening 28 in the hardmask layer 26.

An etching process is used to remove the unmasked dielectric material of the hardmask layer 26 and define the opening 28 in the hardmask layer 26. The arrangement of the opening 28 in the hardmask layer 26 relative to the fins 10, 11 and gate structures 18 is diagrammatically shown in FIG. 1 by a dashed rectangle. The opening 28 in the hardmask layer 26 is arranged over a section of the gate structure 18 that overlaps with sections of each of the fins 10, 11 and portions of the shallow trench isolation region 16 between the fins 10, 11 and surrounding the fins 10, 11. After etching the hardmask layer 26, the etching process may be continued to remove the gate cap 20 from the section of the gate structure 18, which reveals the section of the gate structure 18.

Figure 5:
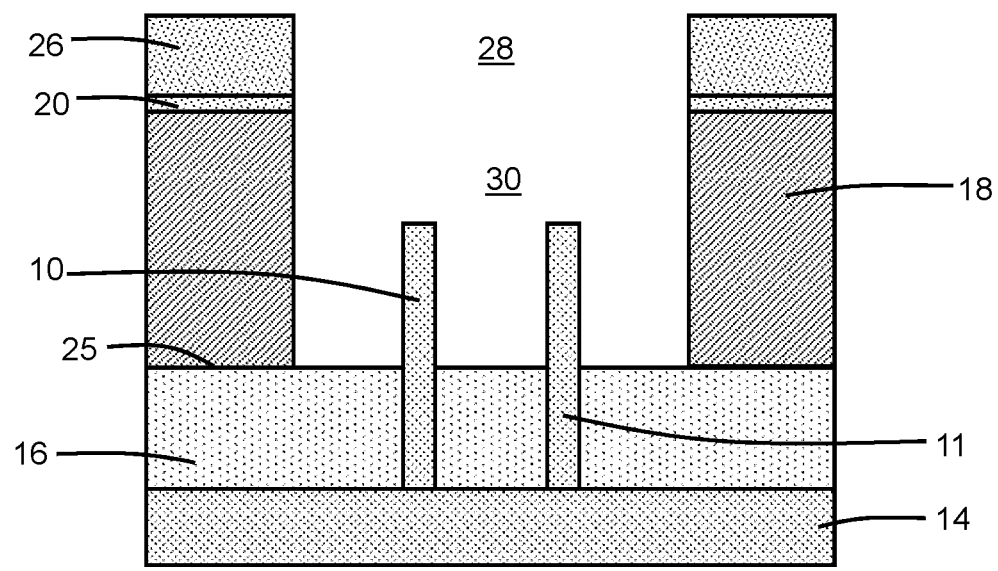
FIGS. 5, 5A are cross-sectional views of the structure at a fabrication stage of the processing method subsequent to FIGS. 4, 4A.
Figure 5A:
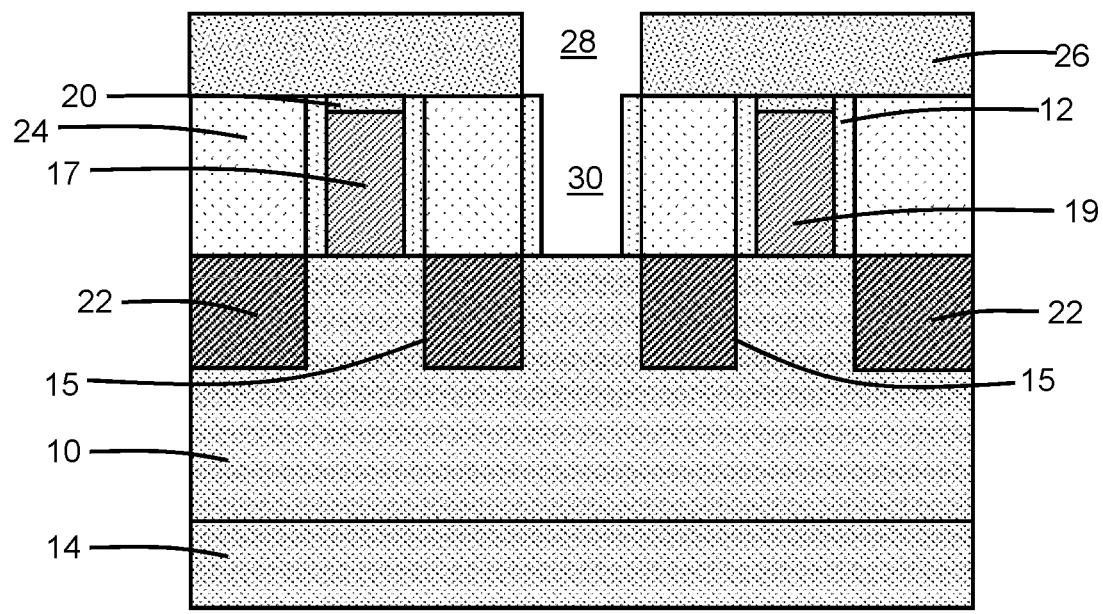

With reference to FIGS. 5, 5A in which like reference numerals refer to like features in FIGS. 4, 4A and at a subsequent fabrication stage of the processing method, the section of the gate structure 18 exposed inside the opening 28 is removed by an etching process, and the thin dielectric layer 21 is subsequently removed from the exposed sections of the fins 10, 11 with an etching process. The removal of the section of the gate structure 18 forms a cut 30 between sections of the gate structure 18 that covered by the hardmask layer 26. The removal of the section of the gate structure 18 and the thin dielectric layer 21 also exposes the sections of the upper portions of the fins 10, 11. Portions of the shallow trench isolation region 16 surrounding the sections of the fins 10, 11 are also exposed inside the opening 28. The exposed sections of the upper portions of the fins 10, 11 are arranged between sections of the fins 10, 11 that are covered by the hardmask layer 26 and that are overlapped by the gate structures 17 and 19. The overlap of the gate structure 18 with the fins 10, 11 is eliminated by the formation of the cut 30.

Figure 6:
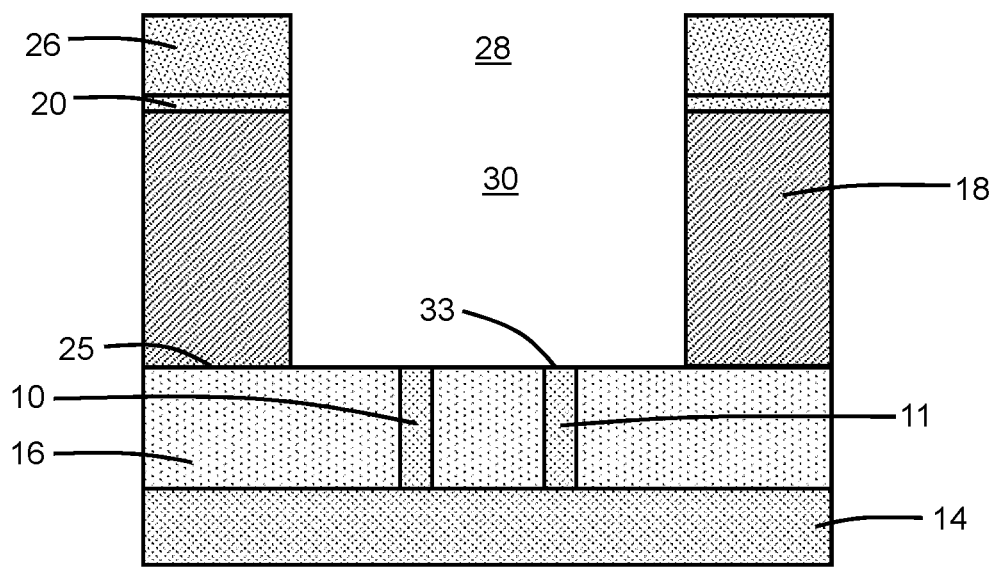
FIGS. 6, 6A are cross-sectional views of the structure at a fabrication stage of the processing method subsequent to FIGS. 5, 5A.
Figure 6A:
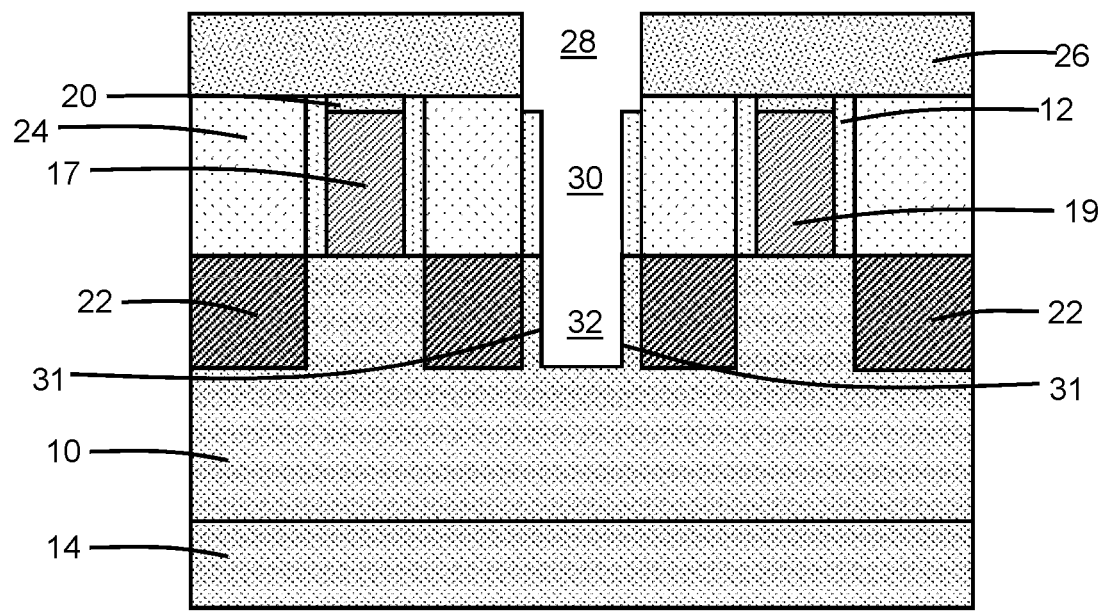

With reference to FIGS. 6, 6A in which like reference numerals refer to like features in FIGS. 5, 5A and at a subsequent fabrication stage of the processing method, the upper portions of the exposed sections of the fins 10, 11 are then removed by an etching process that recesses the sections of the fins 10, 11 and forms recesses or cavities 32 in the exposed sections of the fins 10, 11. In an embodiment, a non-isotropic or anisotropic etch process, which is substantially non-directional, is applied to remove the semiconductor material (e.g., silicon) of the fins 10, 11 selective to the dielectric material of the shallow trench isolation region 16. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process. Although not shown, the hardmask layer 26 may be thinned by the anisotropic etching process removing the upper portions of the fins 10, 11.

The cavity 32 in the section of the upper portion of each of the fins 10, 11 is arranged between intact sections of the upper portions of the fins 10, 11 that are masked by the hardmask layer 26 during the etching process. Inside the opening 28 and cut 30, the lower sections of the exposed sections of the fins 10, 11, which remain following the performance of the etching process, have surfaces 33 that may be substantially coplanar with the top surface 25 of the shallow trench isolation region 16. The lower portions of the exposed sections of the fins 10, 11 remain embedded in, and surrounded by, the shallow trench isolation region 16 after the anisotropic etching process is performed. The upper and lower portions of sections of the fins 10, 11 outside of the opening 28 and masked by the hardmask layer 26 remain intact.

The etching process forming the cavities 32 is self-aligned by the sidewall spacers 12. Surfaces 31 of the intact sections of upper portions of the fin 10 border the cavity 32 in fin 10. Surfaces 31 of the intact sections of upper portions of the fin 11 also border the cavity 32 in fin 11. The surfaces 31 may be arranged above the top surface 25 of the shallow trench isolation region 16, and may be oriented in a vertical direction. Each surface 31 is laterally arranged between one of cavities 32 and one of the source/drain regions 22 adjacent to that cavity 32. Thin strips of the intact sections of the upper portions of the fins 10, 11 are respectively arranged between the surfaces 31 and the source/drain regions 22, and arise from the self-alignment provided by the sidewall spacers 12 during the formation of the cavities 32.

Figure 7:
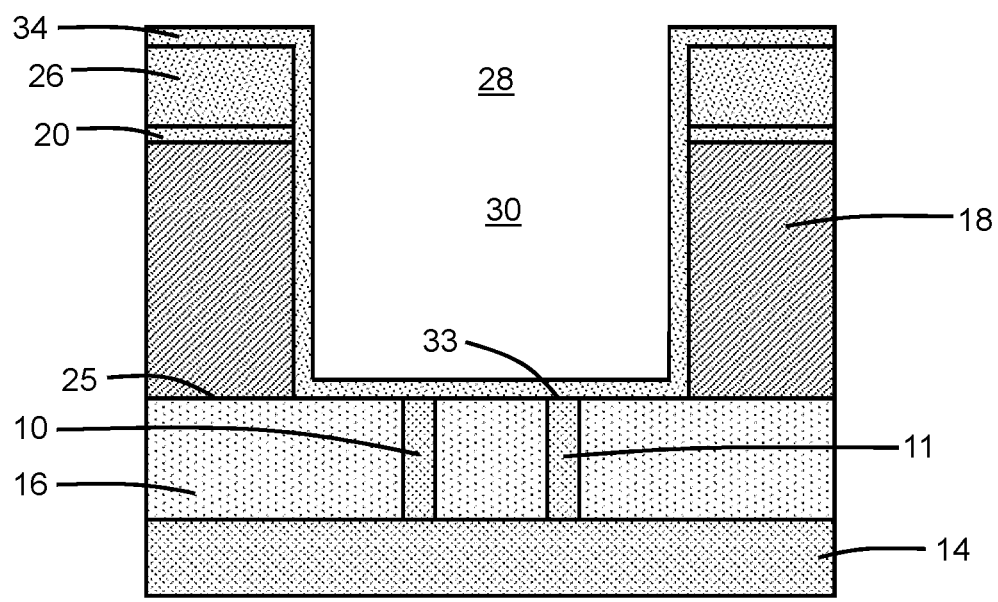
FIGS. 7, 7A are cross-sectional views of the structure at a fabrication stage of the processing method subsequent to FIGS. 6, 6A.
Figure 7A:
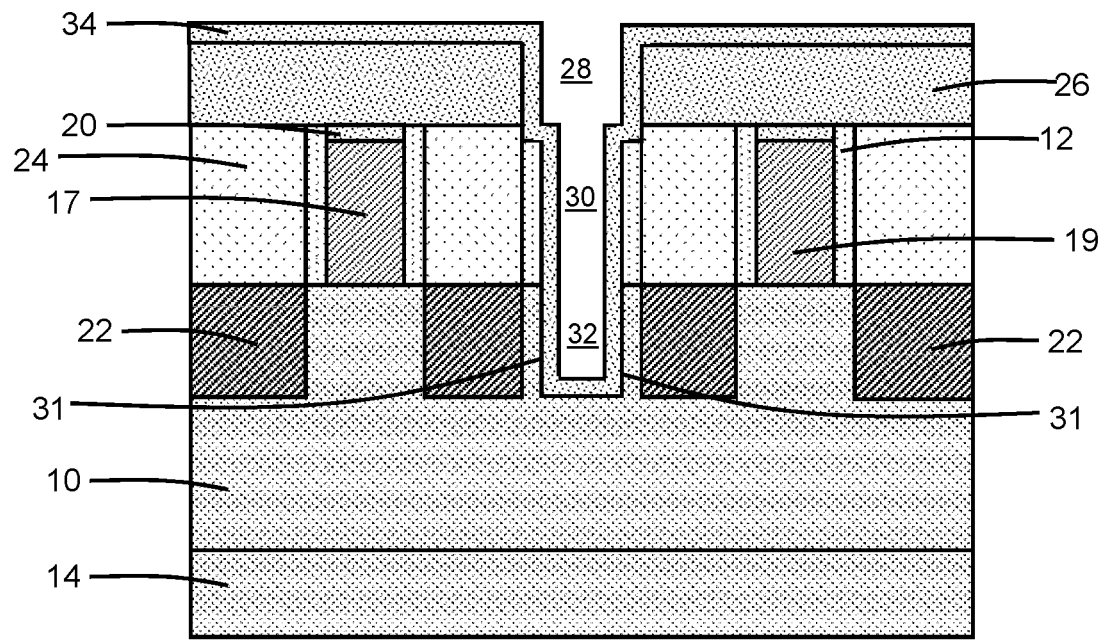

With reference to FIGS. 7, 7A in which like reference numerals refer to like features in FIGS. 6, 6A and at a subsequent fabrication stage of the processing method, a liner 34 is applied inside the opening 28 that coats the surfaces 31 of the intact sections of the upper portions of the fins 10, 11, the surfaces 33 of the lower portions of exposed sections of the fins 10, 11, and the exposed top surface 25 of the shallow trench isolation region 16 about the surfaces 33. The liner 34 also coats the sidewall spacers 12 exposed inside the cut 30 over respective spacer surfaces that are arranged above the surfaces 31 of the fins 10, 11. In an embodiment, the liner 34 may be composed of a thin conformal layer of a dielectric material, such as silicon nitride, deposited by atomic layer deposition.

Figure 8:
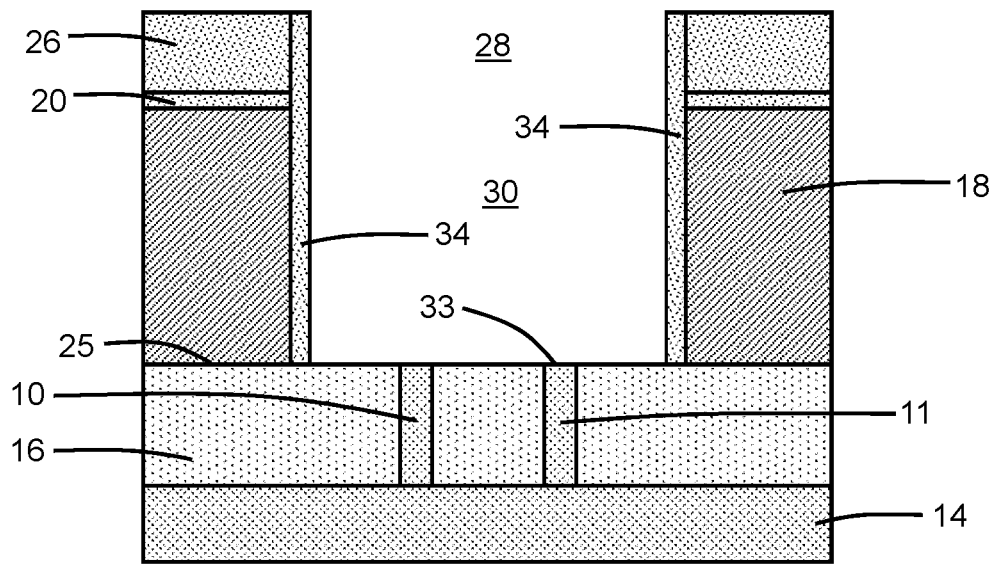
FIGS. 8, 8A are cross-sectional views of the structure at a fabrication stage of the processing method subsequent to FIGS. 7, 7A.
Figure 8A:
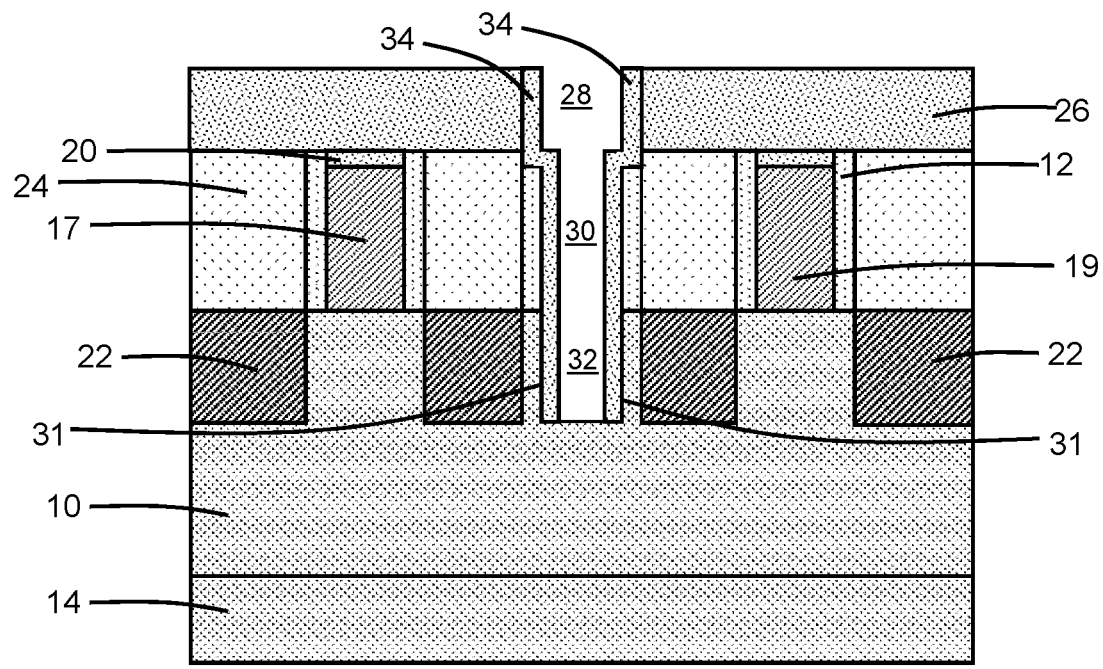

With reference to FIGS. 8, 8A in which like reference numerals refer to like features in FIGS. 7, 7A and at a subsequent fabrication stage of the processing method, the liner 34 is removed from horizontal surfaces inside the opening 28 by an anisotropic etching process. Specifically, the liner 34 is removed from the surfaces 33 of the lower portions of the exposed sections of the fins 10, 11 and the top surface 25 of the shallow trench isolation region 16 about the surfaces 33. Sections of the liner 34 remain, following the performance of the etching process, as secondary spacers that are arranged on the sidewall spacers 12 bordering the cut 30 and also on the surfaces 31 of the intact sections of the upper portions of the fins 10, 11 bordering the cavities 32. The surfaces 33 of the lower portions of the exposed sections of the fins 10, 11 are revealed at the bottom of the cavities 32.

The sections of the liner 34 are laterally arranged between the source/drain regions 22 and the cavities 32 in the upper portions of the exposed sections of the fins 10, 11. The sections of the liner 34 are also laterally arranged adjacent to the surfaces 31 of the upper portions of the intact sections of the fins 10, 11. In an embodiment, the sections of the liner 34 may be arranged directly on the surfaces 31.

Figure 9:
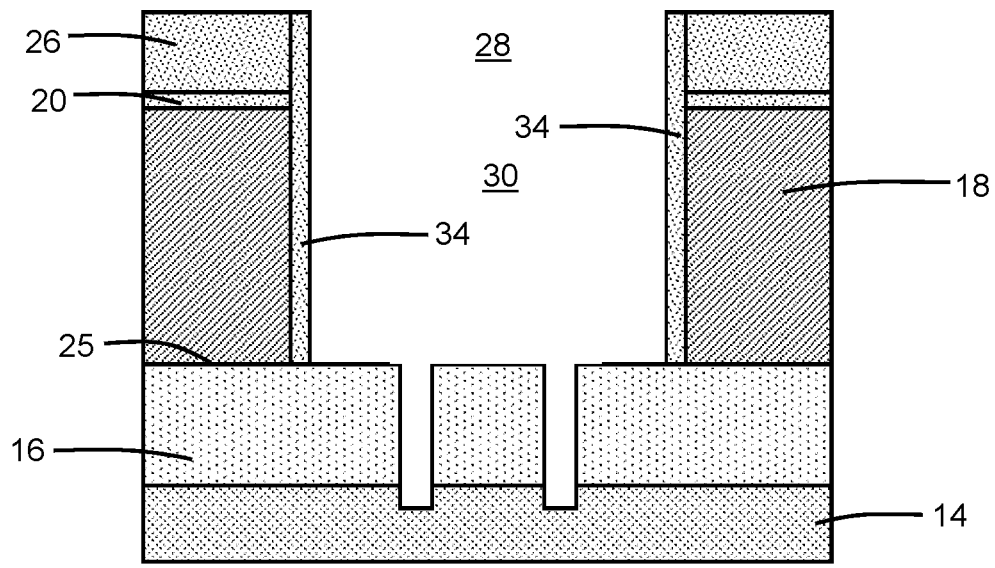
FIGS. 9, 9A are cross-sectional views of the structure at a fabrication stage of the processing method subsequent to FIGS. 8, 8A.
Figure 9A:
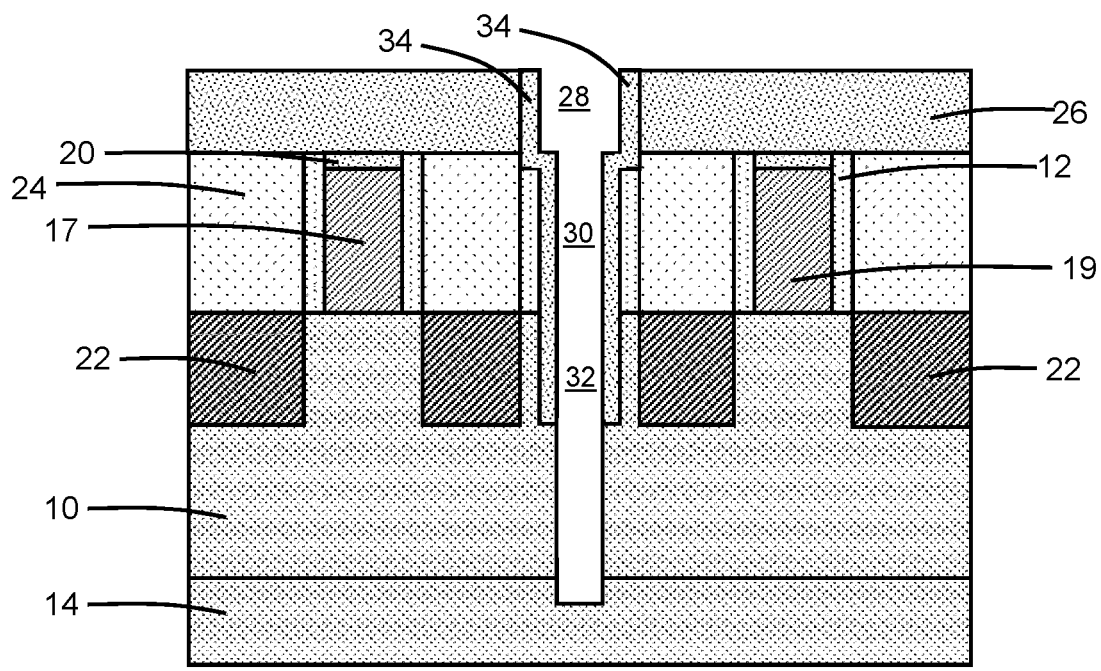

With reference to FIGS. 9, 9A in which like reference numerals refer to like features in FIGS. 8, 8A and at a subsequent fabrication stage of the processing method, the lower portions of the exposed sections of the fins 10, 11 are removed after forming the liner 34, which increases the depth of cavities 32. The lower portions of the exposed sections of the fins 10, 11 may be removed by an etching process, such as an isotropic etching process having both lateral and vertical etching components. For example, the isotropic etching process may be a reactive ion etching process that is carbon-based or hydrogen bromide-based. The etching process is chosen to remove the semiconductor material of the fins 10, 11 selective to the dielectric material of the liner 34 and the dielectric material of the shallow trench isolation region 16. Due to the etch selectively, the sections of the liner 34 on the surfaces 31 bordering the cavities 32 prohibit lateral etching of the fins 10, 11 in the vicinity of the source/drain regions 22, which protects the epitaxial semiconductor material constituting the source/drain regions 22 against erosion when removing the lower portions of the exposed sections of the fins 10, 11 with the isotropic etching process.

The cavities 32 are extended by the isotropic etching process fully through the fins 10, 11 to the substrate 14. The removal of the lower portions of the exposed sections of the fins 10, 11 also extends the cavities 32 into the shallow trench isolation region 16 and fully through the shallow trench isolation region 16 to the substrate 14. In an embodiment, an overetch may be used to ensure complete removal of the lower sections of the fins 10, 11. As a result, each of the cavities 32 may extend to a shallow depth into a portion of the substrate 14. For example, the cavities 32 may extend in part into the portion of the substrate 14 beneath the fins 10, 11.

Only a portion of each cavity 32 is lined by the liner 34 and, in particular, only the portion of each cavity 32 adjacent to the source/drain regions 22 is lined by the liner 34. A portion of each cavity 32 below the source/drain regions 22 is not lined by the liner 34, including the bottom of each cavity 32 at the intersection with the substrate 14 such that the surfaces 33 are exposed to permit the completion of the fin removal.

Figure 10:
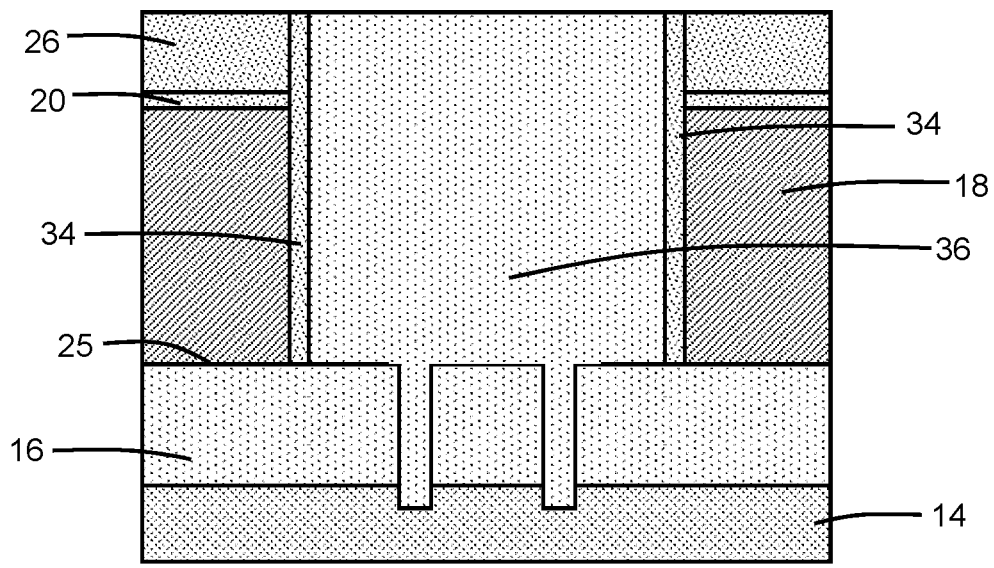
FIGS. 10, 10A are cross-sectional views of the structure at a fabrication stage of the processing method subsequent to FIGS. 9, 9A.
Figure 10A:
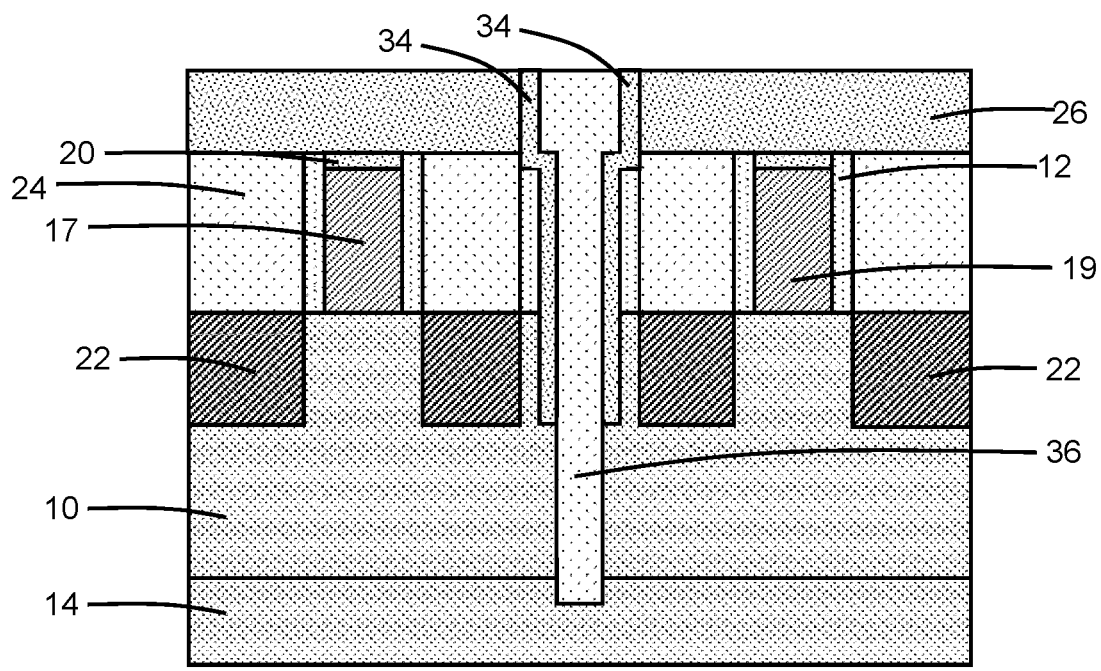

With reference to FIGS. 10, 10A in which like reference numerals refer to like features in FIGS. 9, 9A and at a subsequent fabrication stage of the processing method, a dielectric layer 36 is deposited inside the opening 28 and planarized by, for example, chemical mechanical polishing. Portions of the dielectric layer 36 fill the cavities 32 formed by the removal of the lower portions of the exposed sections of the fins 10, 11 and the cut 30 in the gate structure 18. Inside the cavities 32, the dielectric layer 36 may be in direct contact with the sections of the liner 34 on the surfaces 31.

Figure 11:
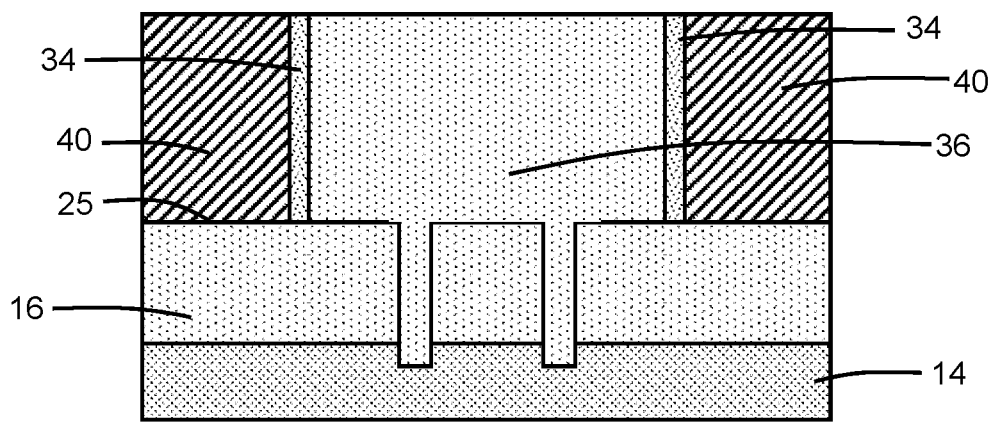
FIGS. 11, 11A are cross-sectional views of the structure at a fabrication stage of the processing method subsequent to FIGS. 10, 10A.
Figure 11A:
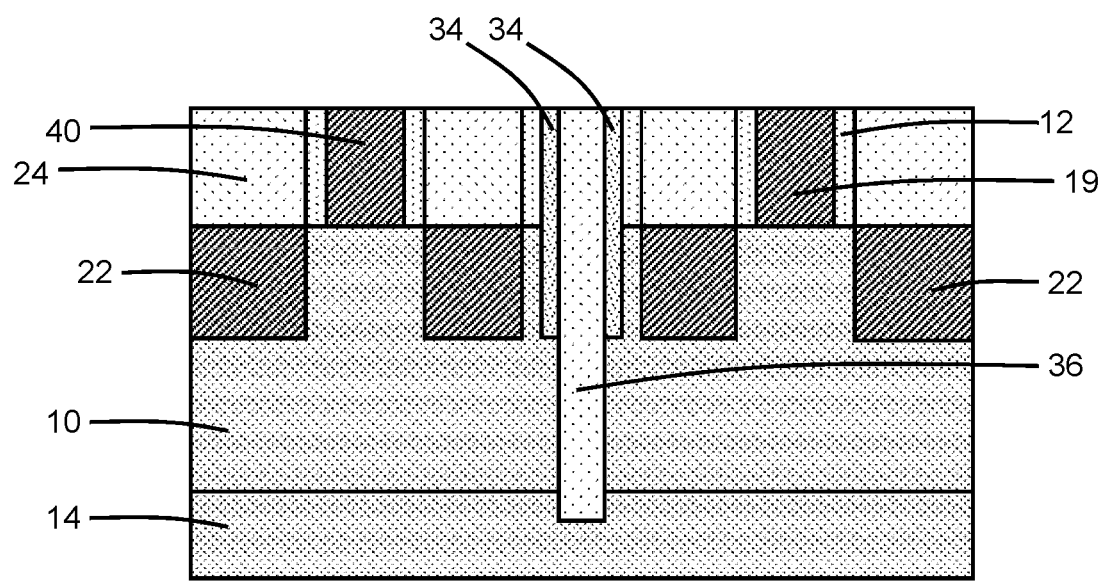

With reference to FIGS. 11, 11A in which like reference numerals refer to like features in FIGS. 10, 10A and at a subsequent fabrication stage of the processing method, the gate structures 17 and 19, the intact sections of the gate structure 18, and their gate caps 20 are removed as part of a replacement metal gate process, and gate structures 40 are formed in the opened spaces. Each gate structure 40 may include a gate electrode and a gate dielectric between the gate electrode and the respective fins 10, 11. The gate electrode may include one or more conformal barrier metal layers and/or work function metal layers, such as metal layers composed of titanium aluminum carbide and/or titanium nitride, and/or a metal gate fill layer composed of a conductor, such as tungsten, cobalt, or aluminum, and the gate dielectric may be composed of a high-k dielectric material, such as hafnium oxide. The gate structures 40 may be recessed and self-aligned contact caps (not shown) composed of a dielectric material, such as silicon nitride, may be formed over the recessed gate structures 40. One of the gate structures 40 includes sections that are arranged on opposite sides of the dielectric layer 36.

Middle-of-line (MOL) processing and back-end-of-line (BEOL) processing follow, which includes formation of silicide, contacts, vias, and wiring for an interconnect structure coupled with the field effect transistor.

In the completed structure, the dielectric layer 36, which replaces the removed sections of the fins 10, 11 and the removed section of the gate structure 18, defines a single diffusion break between a field-effect transistor formed using the gate structure 40 that replaces the gate structure 17 and a field-effect transistor formed using the gate structure 40 that replaces the gate structure 19. The single-diffusion break is formed subsequent to the formation of the source/drain regions 22. The liner 34 operates to prevent loss of the epitaxially-grown semiconductor material of the source/drain regions 22 by providing an etch barrier during the isotropic etching process removing the lower portions of the fins 10, 11.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a single diffusion break, the structure comprising:
   a substrate;
   a semiconductor fin arranged over the substrate, the semiconductor fin including an upper portion, a lower portion arranged between the upper portion and the substrate, a first cavity and a second cavity;
   a trench isolation region surrounding the lower portion of the semiconductor fin, the trench isolation region having a top surface arranged above the lower portion of the semiconductor fin and arranged below the upper portion of the semiconductor fin,
   a first source/drain region inside the first cavity in the semiconductor fin;
   a dielectric layer inside the second cavity in the semiconductor fin; and
   a liner comprised of a dielectric material, the liner including a first section inside the second cavity, the first section of the liner laterally arranged between the dielectric layer and the first source/drain region, and the first section of the liner arranged above the top surface of the trench isolation region.

2. The structure of claim 1 wherein the second cavity extends fully through the semiconductor fin.

3. The structure of claim 2 wherein the second cavity extends into a portion of the substrate below the semiconductor fin.

4. The structure of claim 1 wherein the first source/drain region is arranged laterally adjacent to the first section of the liner.

5. The structure of claim 1 wherein the first section of the liner is arranged entirely above the top surface of the trench isolation region.

6. The structure of claim 1 wherein the semiconductor fin includes a third cavity, the second cavity is arranged in the semiconductor fin laterally between the first cavity and the third cavity, and further comprising:
   a second source/drain region in the third cavity in the semiconductor fin,
   wherein the liner includes a second section inside the second cavity, and the second section of the liner is arranged between the dielectric layer and the second source/drain region.

7. The structure of claim 6 wherein the liner is located on only a portion of the second cavity.

8. The structure of claim 6 further comprising:
a first sidewall spacer arranged over the semiconductor fin; and
a second sidewall spacer arranged over the semiconductor fin,
wherein the liner includes a second section and a third section arranged above the top surface of the trench isolation region, the second section of the liner is located on the second sidewall spacer, and the third section of the liner is located on the first sidewall spacer.

9. The structure of claim 1 wherein the semiconductor fin includes a surface bordering the second cavity, and the first section of the liner is arranged directly on the surface.

10. The structure of claim 9 wherein the surface of the semiconductor fin is arranged above the top surface of the trench isolation region.

11. The structure of claim 1 wherein the dielectric material is silicon nitride, and the dielectric layer is comprised of silicon dioxide.

12. The structure of claim 1 further comprising:
a gate structure including a first section and a second section extending transverse to the semiconductor fin,
wherein the dielectric layer is arranged between the first section of the gate structure and the second section of the gate structure.

13. The structure of claim 12 wherein the second cavity extends fully through the semiconductor fin.

14. The structure of claim 13 wherein the second cavity extends into a portion of the substrate beneath the semiconductor fin.

15. The structure of claim 1 further comprising:
a first gate structure extending transverse to the semiconductor fin; and
a second gate structure extending transverse to the semiconductor fin,
wherein the first source/drain region, the dielectric layer, and the first section of the liner are laterally arranged between the first gate structure and the second gate structure.

16. The structure of claim 1 wherein the liner is located on only a portion of the second cavity.

17. The structure of claim 1 further comprising:
a sidewall spacer arranged over the semiconductor fin,
wherein the liner includes a second section arranged above the top surface of the trench isolation region, and the second section of the liner is located on the sidewall spacer.

* * * * *